United States Patent
Liu et al.

(10) Patent No.: US 11,051,401 B2
(45) Date of Patent: Jun. 29, 2021

(54) METHOD OF INTEGRATING AN ELECTRONIC MODULE WITH CONDUCTIVE FABRIC

(71) Applicant: FLEXTRONICS AP, LLC, San Jose, CA (US)

(72) Inventors: Weifeng Liu, Dublin, CA (US); Anwar Mohammed, San Jose, CA (US); Murad Kurwa, San Jose, CA (US)

(73) Assignee: FLEXTRONICS AP, LLC, San Jose, CA (US)

( * ) Notice: Subject to any disclaimer, the term of this patent is extended or adjusted under 35 U.S.C. 154(b) by 190 days.

(21) Appl. No.: 16/201,116

(22) Filed: Nov. 27, 2018

(65) Prior Publication Data
US 2019/0098753 A1    Mar. 28, 2019

Related U.S. Application Data

(62) Division of application No. 14/574,944, filed on Dec. 18, 2014, now Pat. No. 10,201,080.

(51) Int. Cl.
*H05K 1/03* (2006.01)
*H05K 1/11* (2006.01)
(Continued)

(52) U.S. Cl.
CPC .......... *H05K 1/038* (2013.01); *D03D 1/0088* (2013.01); *H01L 23/48* (2013.01); *H05K 1/09* (2013.01);
(Continued)

(58) Field of Classification Search
CPC .......... H05K 1/038; H05K 1/09; H05K 1/115; H05K 1/181; H05K 1/0366; H05K 3/10;
(Continued)

(56) References Cited

U.S. PATENT DOCUMENTS 4,967,038 A    10/1990  Gevins et al.
5,991,922 A    11/1999  Banks
(Continued)

FOREIGN PATENT DOCUMENTS

DE    102010060222 A1    5/2012
DE    202013002601 A1    7/2014
(Continued)

OTHER PUBLICATIONS

Extended European Search Report for EP 15201038.5 dated May 23, 2016, pp. 1-3.
Written Opinion for EP 15201038.5 dated May 23, 2016, pp. 1-4.

*Primary Examiner* — Peter Dungba Vo
*Assistant Examiner* — Jeffrey T Carley
(74) *Attorney, Agent, or Firm* — Volpe Koenig

(57) ABSTRACT

An electronic module assembly and method of assembling an electronic module to a conductive fabric are provided. An electronic module assembly comprises a non-conductive fabric and a conductive fabric covering at least part of a first side of the non-conductive fabric. An electronics module is disposed on the conductive fabric, and a portion of the electronics module includes a wall defining a through hole. A fastener passing through the through hole and passing through the conductive fabric is configured to electronically couple the electronics module to the conductive fabric.

12 Claims, 3 Drawing Sheets

(51) Int. Cl.
  *H01L 23/48* (2006.01)
  *D03D 1/00* (2006.01)
  *H05K 1/09* (2006.01)
  *H05K 1/18* (2006.01)
  *H05K 3/10* (2006.01)
  *H05K 3/32* (2006.01)
  *H05K 9/00* (2006.01)
  *H05K 1/02* (2006.01)
  *H05K 3/42* (2006.01)

(52) U.S. Cl.
  CPC ............ *H05K 1/115* (2013.01); *H05K 1/181* (2013.01); *H05K 3/10* (2013.01); *H05K 3/32* (2013.01); *D03D 2700/0166* (2013.01); *H05K 1/0283* (2013.01); *H05K 1/0366* (2013.01); *H05K 1/0373* (2013.01); *H05K 1/113* (2013.01); *H05K 3/42* (2013.01); *H05K 9/009* (2013.01); *H05K 2201/05* (2013.01); *H05K 2201/0959* (2013.01); *H05K 2201/10242* (2013.01); *H05K 2201/10295* (2013.01); *H05K 2201/10303* (2013.01)

(58) Field of Classification Search
  CPC ............ H05K 3/32; H05K 3/42; H05K 9/009; H05K 2201/05; D03D 1/0088; D03D 2700/0166
  See application file for complete search history.

(56) References Cited

U.S. PATENT DOCUMENTS

| 7,308,294 | B2* | 12/2007 | Hassonjee ............ A61B 5/0245 600/386 |
| 2002/0076948 | A1* | 6/2002 | Farrell ...................... B32B 3/08 438/800 |
| 2002/0173175 | A1 | 11/2002 | Brodsky et al. |
| 2005/0235482 | A1* | 10/2005 | Deaett .................... H01P 11/00 29/600 |
| 2006/0124193 | A1* | 6/2006 | Orr ...................... D03D 13/004 139/421 |
| 2010/0147562 | A1* | 6/2010 | Chu .................... B32B 38/0004 174/254 |
| 2010/0302745 | A1* | 12/2010 | Hsu ........................ H05K 3/32 361/749 |
| 2011/0226515 | A1 | 9/2011 | Son et al. |
| 2011/0290544 | A1 | 12/2011 | Hirose et al. |
| 2014/0069704 | A1 | 3/2014 | Turpuseema et al. |
| 2014/0313743 | A1 | 10/2014 | Brun et al. |
| 2015/0138743 | A1* | 5/2015 | Roy ........................ H01B 3/50 361/777 |

FOREIGN PATENT DOCUMENTS

| EP | 2107642 A2 | 10/2009 | |
| WO | WO-2007143966 A2 * | 12/2007 | .......... H03K 17/962 |
| WO | 2008120138 A1 | 10/2008 | |

* cited by examiner

METHOD OF INTEGRATING AN ELECTRONIC MODULE WITH CONDUCTIVE FABRIC

CROSS REFERENCE TO RELATED APPLICATION

This application is a divisional of U.S. patent application Ser. No. 14/574,944 filed on Dec. 18, 2014, which is incorporated by reference herein as if fully set forth.

FIELD OF INVENTION

Embodiments of the present disclosure generally relate to an electronic module assembled to a conductive fabric, and a method of assembling an electronic module to a conductive fabric.

BACKGROUND

In some applications, it may be desirable to form an assembly of an electronic module on a conductive fabric to form an integrated system. Conventional assemblies include modules stitched to a conductive fabric using conductive wire. Stitching is an intensive manual process not suitable for high volume or automation. In some stitched assemblies, the stitches become loose as the fabric flexes. It has also been noted that some conductive fabrics are not well suited for joining techniques requiring elevated temperatures.

Accordingly, a need exists for an improved electronic module assembly and method of assembling an electronic module to a conductive fabric.

SUMMARY

Embodiments of an electronic module assembly and method of assembling an electronic module to a conductive fabric are provided herein. In an embodiment, an electronic module assembly comprises a non-conductive fabric and a conductive fabric covering at least part of a first side of the non-conductive fabric. An electronics module is disposed on the conductive fabric, and a portion of the electronics module includes a wall defining a through hole. A fastener passing through the through hole and passing through the conductive fabric is configured to electronically couple the electronics module to the conductive fabric.

In an embodiment, a method of making an electronics assembly comprising an electronic module and a conductive fabric is disclosed. The method comprises forming a substrate including a conductive fabric covering at least part of a first side of a non-conductive fabric; disposing an electronics module having one or more through holes on the substrate with the through holes aligned with a portion of the conductive fabric; inserting a fastener to pass through the through hole and through the substrate; and clamping the module to the substrate to form an electrical connection using the fastener.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
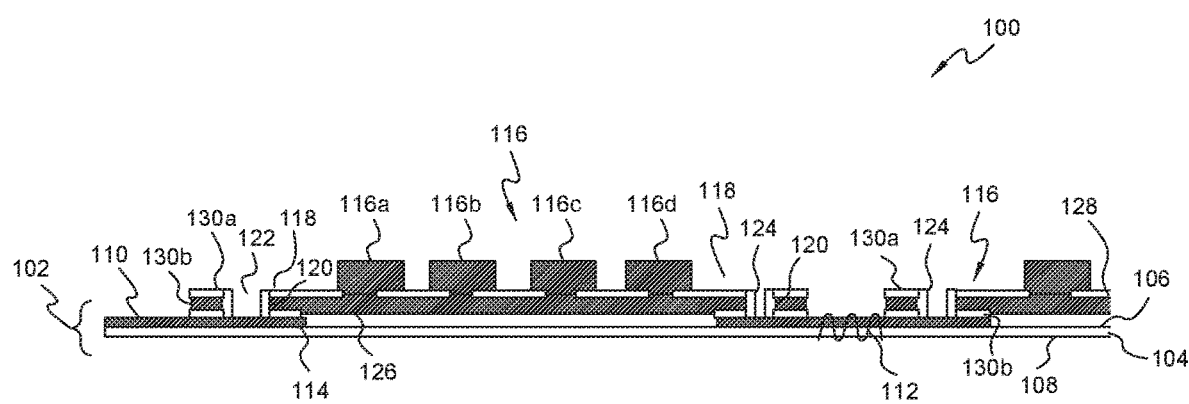
FIG. 1 depicts a side sectional view of an electronics module assembly in accordance with an embodiment of this disclosure.

Certain terminology is used in the following description for convenience only and is not limiting. "Conductive" is used to mean "electrically conductive" unless the context clearly calls for a different definition. Conversely, "non-conductive" means resistant to electrical conduction, or an electrical insulator. The words "front," "rear," "upper" and "lower" designate directions in the drawings to which reference is made. A reference to a list of items that are cited as "at least one of a, b, or c" (where a, b, and c represent the items being listed) means any single one of the items a, b, or c, or combinations thereof. The terminology includes the words specifically noted above, derivatives thereof and words of similar import.

FIG. 1 depicts a side sectional view of an electronics module assembly 100 comprising a substrate 102 including a non-conductive fabric 104, a conductive fabric 110, and an electronics module 116 (one electronics module and a partial are shown in FIG. 1). The non-conductive fabric 104 has a first side 106 and a second side 108 opposite and generally parallel with the first side 106. The conductive fabric 110 covers at least a part of the first side 106 and may be attached to the non-conductive fabric 104 using one or more of stitching or gluing. If stitching is used, the thread used to attach the conductive fabric 110 to the non-conductive fabric 104 is preferably a non-conductive thread 112, for example a thread formed from, in non-limiting examples, natural fibers such as cotton, or synthetic fibers such as polyester or nylon. If gluing is used, the glue 114, or adhesive, is preferably non-conductive.

An electronics module 116 is positioned on the substrate 102 so that a portion of the module 116 is disposed on the conductive fabric 110 with a bottom surface 126 of the module 116 adjacent to the conductive fabric 110 and a top surface 128 spaced apart from the conductive fabric 110. The portion 118 disposed on the conductive fabric 110 includes an interior wall 120 that defines a through hole 122 formed through the portion 118. In some embodiments, the wall 120 is plated with a conductive material 124 which may include, in non-limiting examples, silver, gold over nickel, or tin. The bottom surface 126 and the top surface 128 at least partially surrounding the through hole 122 is preferably includes conductive elements 130a, 130b, for example copper pads which may be plated with silver, gold, or nickel.

The electronics module 116 may include, in non-limiting examples, sensors 116a, light sources such as light emitting diodes (LEDs) 116b, recording devices 116c, displays 116d, and the like. Other electronic devices can be included in the electronics module 116 within the scope and spirit of this disclosure.

Figure 2:
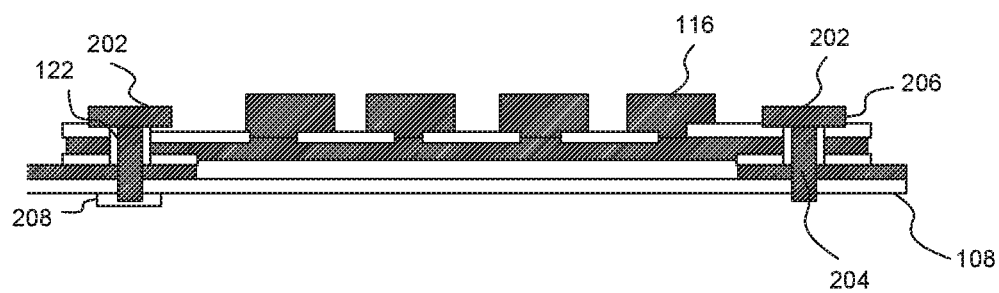
FIG. 2 is a side sectional view of an electronics module assembly in accordance with an embodiment of this disclosure.

As shown in FIG. 2, a fastener 202 is used to clamp the electronics module 116 to the substrate 102 to form an electrical connection between the module and the substrate. In the non-limiting embodiment of FIG. 2, a stem 204 of fastener 202 passes through the through hole 122, penetrates and passes through the conductive fabric 110 and the non-conductive fabric 104 and exits through the second side 108 of the non-conductive fabric 104. In an embodiment, the conductive and non-conductive fabrics 110, 104 may have preformed holes to allow passage of the fastener 202. In another embodiment, the fastener 202 may pierce one or both of the conductive and non-conductive fabrics 110, 104, forming an opening therein.

As shown in FIG. 2, a first end of the fastener 202 has a head 206 larger than the through hole 122 formed in the electronics module 116. The head 206 is configured to contact the conductive elements 130a formed on the top surface 128 of the electronics module 116. In an embodiment, the second end of the fastener 202 is adapted to accept a mating element 208 to facilitate the clamping. For example, the second end of the fastener 202 may include an external thread and the mating element 208 may have a corresponding internal thread to engage the external thread and advance along the length of the stem 204 when rotated.

In another embodiment, the second end of the fastener 202 may be subjected to a compressive load to facilitate clamping. During application of the compressive load, the second end of the fastener 202 may be deformed by the pressure and expand so that the second end becomes larger than the through hole 122.

The fastener 202 is a conductive element formed from an electrically conductive material, for example metal, or from a non-conductive material that is plated with a conductive material. When the electronics module 116 is clamped to the substrate 102, the fastener 202 forms an electrical connection between the electronics module 116 and the conductive fabric 110. The fastener 202 forms a gas-tight connection between the electronics module 116 and the conductive fabric 110.

Figure 3:
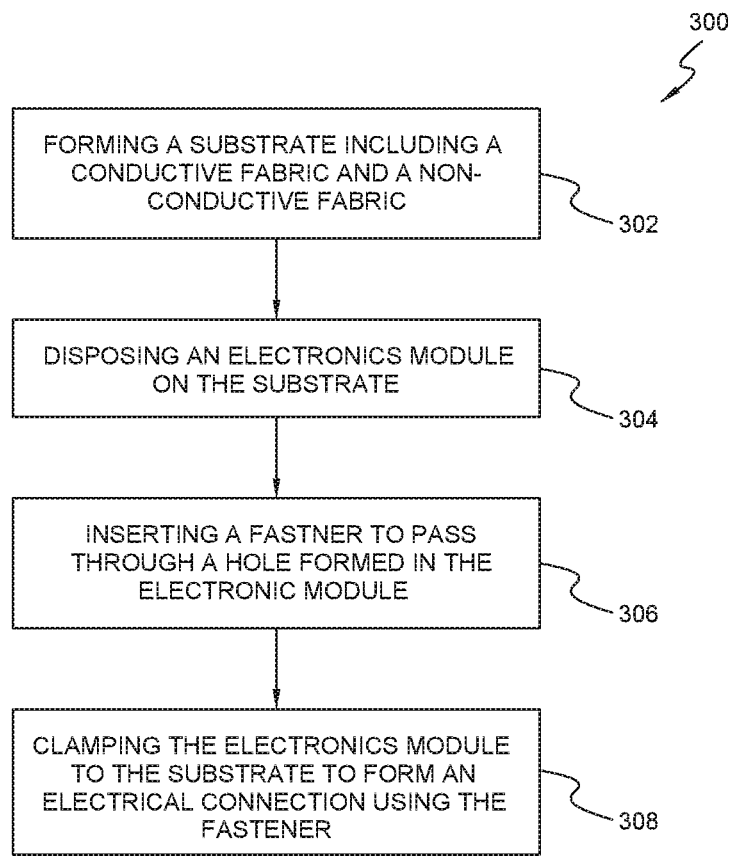
FIG. 3 is a flow diagram in accordance with an embodiment of a method of this disclosure.

The inventors have noted that the disclosed electronics module assembly 100 may provide a durable electrical connection between an electronics module 116, which may be flexible or rigid, and a flexible substrate 102 formed from a conductive fabric 110 and a non-conductive fabric 104. The disclosed assembly may be well-suited for manual or automated assembly, for example using the method 300 of FIG. 3.

At 302, a substrate 102 is formed from a conductive fabric 110 covering at least part of a first side of a non-conductive fabric 104. The conductive fabric 110 may be attached to the non-conductive fabric using one or more of stitching or gluing. The attachment may be accomplished using non-conductive thread for stitching or a non-conductive glue or adhesive for gluing.

At 304, an electronics module 116 is disposed on the substrate 102. The module 116 includes one or more through holes 122 formed though a portion of the module 116. When electronics module 116 is disposed on the substrate 102, the through hole 122 is placed upon, or aligned with, a portion of the conductive fabric 110.

At 306, a fastener is inserted to pass through the through hole 122 in the electronics module 116 and to pass through the substrate 102. One or both of the conductive fabric 110 and the non-conductive fabric 104 may have a preformed hole formed therein to accept the fastener 202.

At 208, the electronics module 116 is clamped to the substrate 102 to form an electrical connection using the fastener 202.

Thus an electronics module assembly and method of assembling an electronic module to a conductive fabric are provided herein. The inventive module may advantageously provide a durable electrical connection between an electronics module and a substrate. The inventive method may facilitate manual or automated assembly of an electronics module to a substrate with increased reliability, thereby improving production throughput.

Having thus described the present invention in detail, it is to be appreciated and will be apparent to those skilled in the art that many physical changes, only a few of which are exemplified in the detailed description of the invention, could be made without altering the inventive concepts and principles embodied therein. It is also to be appreciated that numerous embodiments incorporating only part of the preferred embodiment are possible which do not alter, with respect to those parts, the inventive concepts and principles embodied therein. The present embodiment and optional configurations are therefore to be considered in all respects as exemplary and/or illustrative and not restrictive, the scope of the invention being indicated by the appended claims rather than by the foregoing description, and all alternate embodiments and changes to this embodiment which come within the meaning and range of equivalency of said claims are therefore to be embraced therein.

What is claimed is:

1. A method of making an electronics assembly comprising an electronics module and a conductive fabric, the method comprising:
    forming a substrate including a conductive fabric covering part of a first side of a non-conductive fabric;
    disposing an electronics module comprising a top surface, a bottom surface, and walls defining a plurality of through holes, on the conductive fabric of the substrate such that each of the plurality of through holes of the electronics module is aligned with a portion of the conductive fabric;
    inserting a plurality of fasteners to each pass through a corresponding through hole of the plurality of through holes and through at least the conductive fabric; and
    clamping the electronics module to the substrate to form an electrical connection using the plurality of fasteners.

2. The method of claim 1, wherein forming the substrate further includes forming covered portions of the non-conductive fabric that are covered by conductive fabric and at least one uncovered portion of the non-conductive fabric that is not covered by the conductive fabric.

3. The method of claim 2, wherein the electronics module extends over the uncovered portion forming a space between the bottom surface of the electronics module and the uncovered portion of the non-conductive fabric upon clamping of the electronics module to the substrate.

4. The method of claim 1, wherein forming the substrate includes attaching the conductive fabric to the non-conductive fabric using one or more of stitching or gluing.

5. The method of claim 1, wherein inserting further comprises inserting each of the plurality of fasteners to pass through a corresponding through hole of the plurality of through holes, the conductive fabric, and the non-conductive fabric.

6. The method of claim 1, wherein the clamping forms a gas tight connection between the module and the conductive fabric.

7. The method of claim 1, wherein the non-conductive fabric is flexible.

8. The method of claim 1, wherein the conductive fabric is flexible.

9. The method of claim 1, wherein the walls are plated with a conductive material.

10. The method of claim 1, wherein each fastener of the plurality of fasteners is formed from a metal.

11. The method of claim 1, wherein at least a portion of the top surface and at least a portion of the bottom surface are plated with a conductive material at least at locations surrounding the plurality of through holes.

12. The method of claim 11, wherein each fastener of the plurality of fasteners comprises:
- a head configured to contact the portion of the top surface of the electronics module surrounding the one or more through holes, and
- a second end,
- the second end of the fastener is configured to accept a mating element to facilitate clamping.

\* \* \* \* \*